(12) United States Patent
Park

(10) Patent No.: US 9,412,803 B2
(45) Date of Patent: Aug. 9, 2016

(54) DISPLAY DEVICE

(71) Applicant: Samsung Display Co., Ltd., Yongin-si, Gyeonggi-do (KR)

(72) Inventor: Jin Suk Park, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/920,800

(22) Filed: Oct. 22, 2015

(65) Prior Publication Data

US 2016/0204184 A1  Jul. 14, 2016

(30) Foreign Application Priority Data

Jan. 14, 2015  (KR) .......................... 10-2015-0007001

(51) Int. Cl.
*H01L 29/12* (2006.01)
*H01L 27/32* (2006.01)
*H01L 25/16* (2006.01)
*H01L 29/786* (2006.01)

(52) U.S. Cl.
CPC ............ *H01L 27/3276* (2013.01); *H01L 25/16* (2013.01); *H01L 27/3223* (2013.01); *H01L 27/3262* (2013.01); *H01L 27/3265* (2013.01); *H01L 29/7869* (2013.01); *H01L 29/78675* (2013.01)

(58) Field of Classification Search
CPC ............ H01L 27/3276; H01L 27/3262; H01L 2/3265; H01L 27/3223
USPC .......................................................... 257/71
See application file for complete search history.

(56) References Cited

U.S. PATENT DOCUMENTS

| 7,420,278 | B2 * | 9/2008 | Tomita ................ H01L 23/5329 257/753 |
| 8,399,989 | B2 | 3/2013 | Lin et al. |
| 2008/0105947 | A1 * | 5/2008 | Kuzuhara .......... H01L 21/76838 257/506 |
| 2009/0108446 | A1 * | 4/2009 | Nagai ..................... H01L 24/11 257/737 |
| 2009/0108448 | A1 * | 4/2009 | Lee ......................... H01L 24/03 257/738 |
| 2014/0042398 | A1 * | 2/2014 | Choi ................... H01L 27/3244 257/40 |

FOREIGN PATENT DOCUMENTS

| JP | 2002-196703 A | 7/2002 |
| KR | 10-2006-0131245 A | 12/2006 |
| KR | 10-0737896 B1 | 7/2007 |
| KR | 10-2008-0074586 A | 8/2008 |

* cited by examiner

*Primary Examiner* — Douglas Menz
(74) *Attorney, Agent, or Firm* — Knobbe, Martens, Olson & Bear, LLP

(57) ABSTRACT

A display device is disclosed. In one aspect, the device includes a substrate including a display area and a non-display area and a pad electrode unit formed in the non-display area. The pad electrode unit includes a plurality of first metal layers respectively including a plurality of terminals arranged in substantially parallel to each other and a plurality of wirings extending from the terminals and covered by an insulating layer. The pad electrode unit also includes a plurality of second metal layers formed over the insulating layer and connected to the terminals. The pad electrode unit further includes a plurality of dummy metal layers formed between the terminals and the second metal layers or on the top of the insulating layer covering the wirings.

20 Claims, 8 Drawing Sheets

DISPLAY DEVICE

INCORPORATION BY REFERENCE TO ANY PRIORITY APPLICATIONS

This application claims priority to and the benefit of Korean Patent Application No. 10-2015-0007001 filed in the Korean Intellectual Property Office on Jan. 14, 2015, the entire contents of which are incorporated herein by reference.

BACKGROUND

1. Field

The described technology generally relates to a display device.

2. Description of the Related Technology

A flat panel display such as a liquid crystal display (LCD) and an organic light emitting diode (OLED) display basically includes a display panel, a driving chip, and a printed circuit board. The display panel includes a plurality of signal lines including a plurality of scan lines and a plurality of data lines, and a plurality of thin film transistors and a plurality of pixels which are connected to the plurality of signal lines.

The driving chip functions as a data driver or a scan driver and may be mounted on a substrate of the display panel by a chip on glass (COG) method. The printed circuit board outputs a signal for controlling the driving chip to the driving chip and may be configured by a flexible printed circuit (FPC) which is bendable.

SUMMARY OF CERTAIN INVENTIVE ASPECTS

One inventive aspect relates to a pad electrode connected to a driving chip.

Another aspect is a display device capable of preventing corrosion and disconnection of wirings due to a crack of an insulating layer by preventing the crack from being generated on the insulating layer even though misalignment occurs between a pad electrode and a bump of a driving chip.

Another aspect is a display device including: a substrate including a display area and a non-display area; and a pad electrode unit formed in the non-display area. The pad electrode unit includes a first metal layer, a second metal layer, and a dummy metal layer. The first metal layer includes terminals arranged in parallel and wiring passing through the terminals and is covered by an insulating layer. The second metal layer is formed on the insulating layer and connected to the terminals, respectively. The dummy metal layer is formed between the terminal and the second metal layer or on the top of the insulating layer covering the wiring.

The terminals may be arranged by zigzag patterns in two columns and the wirings may connect the terminals and the signal lines of the display area, respectively.

The insulating layer may have via holes positioned to be biased at one side of the terminal, and the second metal layer may contact the terminal by the via hole. The dummy metal layer may be formed between the terminal and the second metal layer and positioned at a planar distance from the via hole.

The dummy metal layer may be insulated from the terminal and the second metal layer by the insulating layer. The surface of the second metal layer may be positioned to be higher than the surface of the insulating layer covering the wiring from the substrate by 3,000 Å to 10,000 Å.

The first metal layer may be formed on the first gate insulating layer with the same material as the gate electrode and the first storage capacitor plate of the display area. The dummy metal layer may be formed on the second gate insulating layer with the same material as the second storage capacitor plate of the display area. The second metal layer may be formed on the interlayer insulating layer with the same material as the source electrode and the drain electrode of the display area.

On the other hand, the dummy metal layer may overlap with the wiring on the insulating layer and be formed with the same material as the second metal layer. The first metal layer may be formed on the first gate insulating layer with the same material as the gate electrode and the first storage capacitor plate of the display area. The second metal layer and the dummy metal layer may be formed on the interlayer insulating layer with the source electrode and the drain electrode of the display area.

The display device may further include a driving chip mounted on the pad electrode unit. The output terminal of the driving chip may be fixed to the pad electrode unit by a bump bonding method.

Another aspect is a display device, comprising: a substrate including a display area and a non-display area; and a pad electrode unit formed in the non-display area, wherein the pad electrode unit includes: a plurality of first metal layers respectively including a plurality of terminals arranged substantially parallel to each other and a plurality of wirings extending from the terminals and covered by an insulating layer; a plurality of second metal layers formed over the insulating layer and connected to the terminals; and a plurality of dummy metal layers formed between the terminals and the second metal layers or on a top surface of the insulating layer covering the wirings.

In the above display device, the terminals are arranged in a substantially zigzag pattern in two columns, and wherein the wirings connect the terminals and signal lines of the display area, respectively. In the above display device, the insulating layer has a plurality of via holes partially exposing the terminals and positioned to be closer to one side of each of the terminals, and wherein the second metal layers contact the terminals through the via holes. In the above display device, the dummy metal layers are formed between the terminals and the second metal layers and positioned at a planar distance from the via holes. In the above display device, the dummy metal layers are insulated from the terminals and the second metal layers by the insulating layer.

In the above display device, a top surface of each of the second metal layers is positioned to be higher than the top surface of the insulating layer, covering the wirings from the substrate, by about 3,000 Å to about 10,000 Å. In the above display device, the display area includes i) source and drain electrodes, ii) a gate electrode interposed between first and second gate insulating layers, the second gate insulating layer being interposed between first and second storage capacitor plates, and iii) an interlayer insulating layer formed over the second storage capacitor plate, wherein the first metal layers are formed over the first gate insulating layer with the same material as the gate electrode and the first storage capacitor plate, wherein the dummy metal layers are formed over the second gate insulating layer with the same material as the second storage capacitor plate, and wherein the second metal layers are formed over the interlayer insulating layer with the same material as the source and drain electrodes.

In the above display device, the dummy metal layers overlap none of the via holes. In the above display device, the dummy metal layers cover the majority of the terminals that are not exposed by the via holes. In the above display device, each of the dummy metal layers at least partially overlaps the wiring of the corresponding first metal layer and is formed of the same material as the second metal layers. In the above display device, the display area includes i) source and drain electrodes, ii) a gate electrode interposed between first and second gate insulating layers, the second gate insulating layer being interposed between first and second storage capacitor plates, and iii) an interlayer insulating layer formed over the second storage capacitor plate, wherein the first metal layers are formed over the first gate insulating layer with the same material as the gate electrode and the first storage capacitor plate, and wherein the second metal layers and the dummy metal layers are formed over the interlayer insulating layer with the same material as the source and drain electrodes.

The above display device further comprises a driving chip mounted on the pad electrode unit, wherein an output terminal of the driving chip is fixed to the pad electrode unit. In the above display device, the first and second metal layers have substantially the same length and width. In the above display device, each of the first metal layers has a substantially rectangular shape, and wherein the wiring of the corresponding first metal layer extends from at least one of the top and bottom sides thereof. In the above display device, each of the second metal layers is greater in area than the terminal of the corresponding first metal layer and the corresponding dummy metal layer.

Another aspect is a display device, comprising: a substrate including a display area and a non-display area; and a pad electrode unit formed in the non-display area, wherein the pad electrode unit includes: a plurality of first metal layers each including a body portion and a wiring portion extending from the body portion; an insulating layer covering the first metal layers; a plurality of second metal layers formed over the insulating layer and connected to the body portions; and a plurality of dummy metal layers formed between the body portions of the first metal layers and the second metal layers.

In the above display device, the insulating layer has a plurality of via holes partially exposing the body portions of the first metal layers, and wherein the second metal layers contact the body portions of the first metal layers through the via holes. In the above display device, the dummy metal layers overlap none of the via holes. In the above display device, the dummy metal layers cover the majority of the body portions that are not exposed by the via holes. In the above display device, each of the body portions of the first metal layers is substantially aligned with the corresponding second metal layer and dummy metal layer in the depth dimension of the display device.

According to at least one of the disclosed embodiments, it is possible to prevent conductive balls from pressing the insulating layer even when misalignment in which the bump is biased toward the wiring in a process of pressing the driving chip occurs. Therefore, it is possible to prevent a crack from being generated on the insulating layer covering the wiring and efficiently prevent corrosion and disconnection of wirings due to the crack.

DETAILED DESCRIPTION OF CERTAIN INVENTIVE EMBODIMENTS

Figure 1:
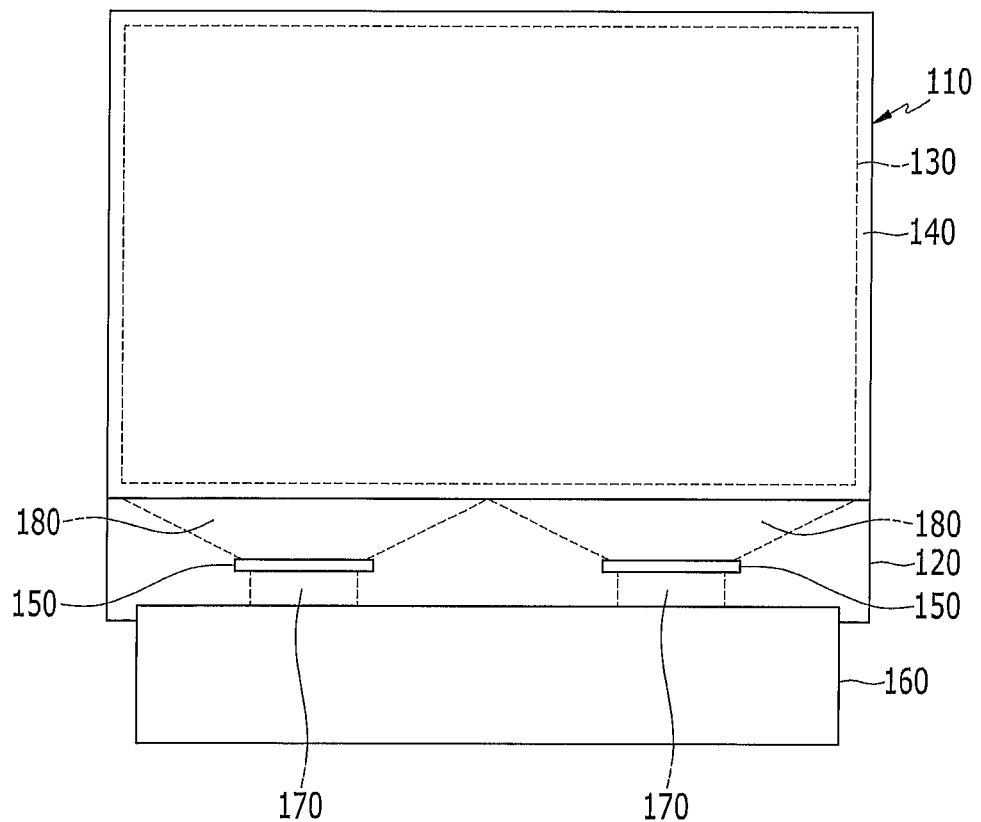
FIG. 1 is a schematic plan view of a display device according to a first exemplary embodiment.

A display panel is generally divided into a display area and a non-display area, and a pad electrode is formed in the non-display area. The pad electrode is connected to a conductive bump on a driving chip by an anisotropic conductive film (ACF). When the ACF is formed on the pad electrode and the driving chip is attached on the pad electrode by pressing the driving chip, misalignment can occur between the pad electrode and the bump. In this case, while conductive balls inside the ACF press an insulating layer outside the pad electrode, the insulating layer can crack. In addition, external moisture that permeates through the crack of the insulating layer can cause corrosion and disconnection of lower wirings of the insulating layer.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

It will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

The size and thickness of each configuration shown in the drawings are arbitrarily shown for understanding and ease of description, but the present disclosure is not limited thereto. In this disclosure, the term "substantially" includes the meanings of completely, almost completely or to any significant degree under some applications and in accordance with those skilled in the art. The term "connected" includes an electrical connection.

FIG. 1 is a schematic plan view of a display device 100 according to a first exemplary embodiment.

Referring to FIG. 1, the display device 100 includes a display panel 110, a driving chip 150, and a printed circuit board 160. The display device 100 may be a liquid crystal display (LCD) or an organic light emitting diode (OLED) display, and hereinafter, the display device 100 will be exemplified as the OLED.

The display panel 110 includes a substrate 120, a display unit 130 formed on the substrate 120, and a sealing unit 140 sealing the display unit 130. In the display unit 130, a plurality of signal lines including a plurality of scan lines, a plurality of data lines, and a plurality of driving voltage lines is formed, and for each pixel, at least two thin film transistors and at least one storage capacitor which are connected to the scan line, the data line, and the driving voltage line are formed.

An OLED is electrically connected to a driving thin film transistor and includes an anode, an organic emission layer, and a cathode. When holes and electrons are injected to the organic emission layer from the anode and the cathode, the holes and the electrons are coupled with each other inside the organic emission layer to generate excitons, and light is emitted by energy generated when the excitons fall down from an excited state to a ground state.

The sealing unit 140 may be configured by an encapsulation substrate assembled with the substrate 120 by a sealant or configured by a thin film encapsulation formed by repetitively laminating inorganic layers and organic layers. The sealing unit 140 seals the display unit 130 to block a contact with external air.

An area where the display unit 130 of the display panel 110 is formed becomes a display area, and an area other than the display unit 130 becomes a non-display area. The driving chip 150 is mounted on the non-display area by a chip on glass (COG) method, and the printed circuit board (PCB) 160 is connected to an edge of the display panel 110. The PCB 160 may be configured by a flexible printed circuit (FPC) which is bendable.

The driving chip 150 includes an input terminal and an output terminal. The input terminal of the driving chip 150 is electrically connected to the PCB 160 through a first wiring unit 170 formed on the substrate 120. The output terminal of the driving chip 150 is electrically connected to predetermined signal lines among the plurality of signal lines provided in the display unit 130 through a second wiring unit 180 formed on the substrate 120. For example, when the driving chip 150 functions as the data driver, the output terminal of the driving chip 150 is electrically connected to the data lines.

A pad electrode unit (not illustrated) is formed at an end of the second wiring unit 180, and the output terminal of the driving chip 150 is fixed onto the pad electrode unit by a bump bonding method.

Figure 2:
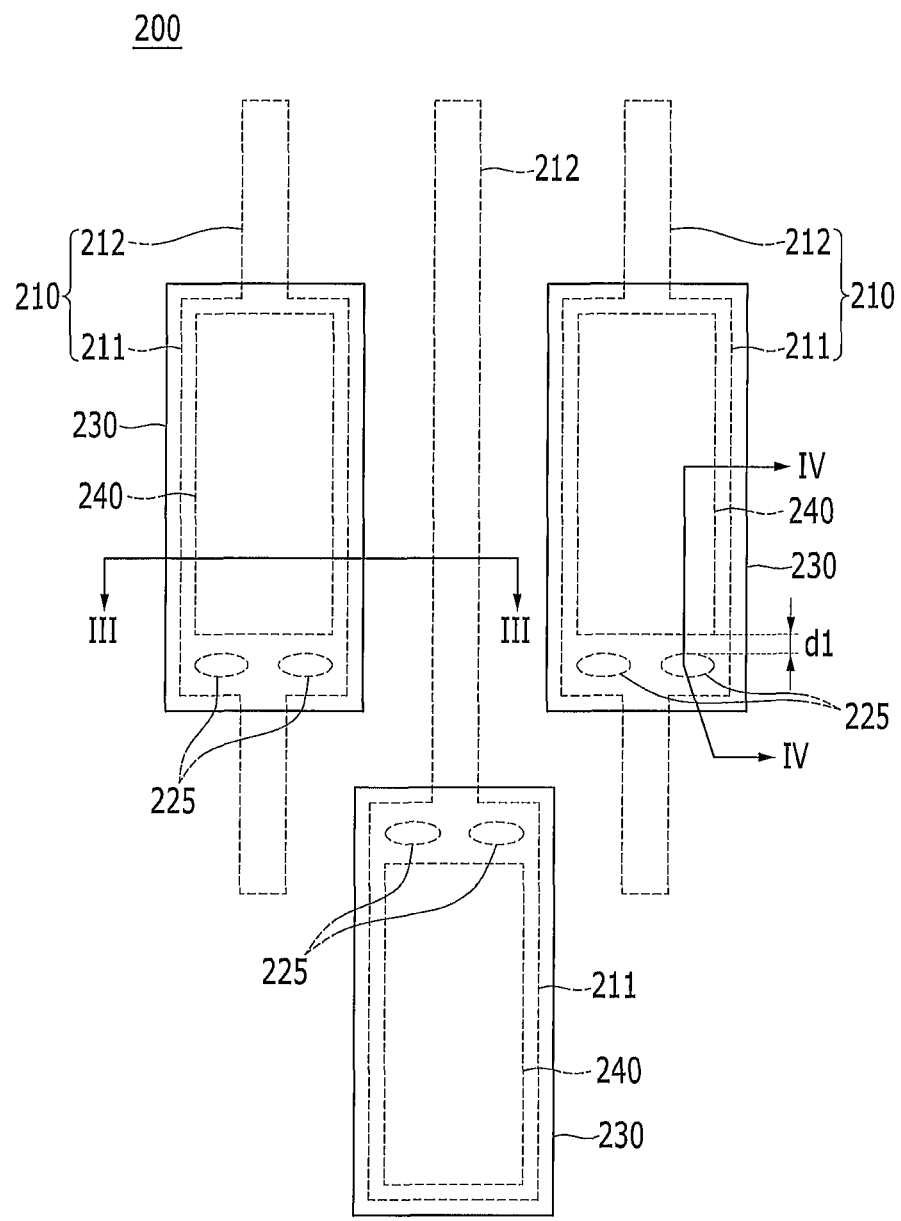
FIG. 2 is a plan view illustrating a pad electrode unit of a second wiring unit in the display panel illustrated in FIG. 1.
Figure 3:
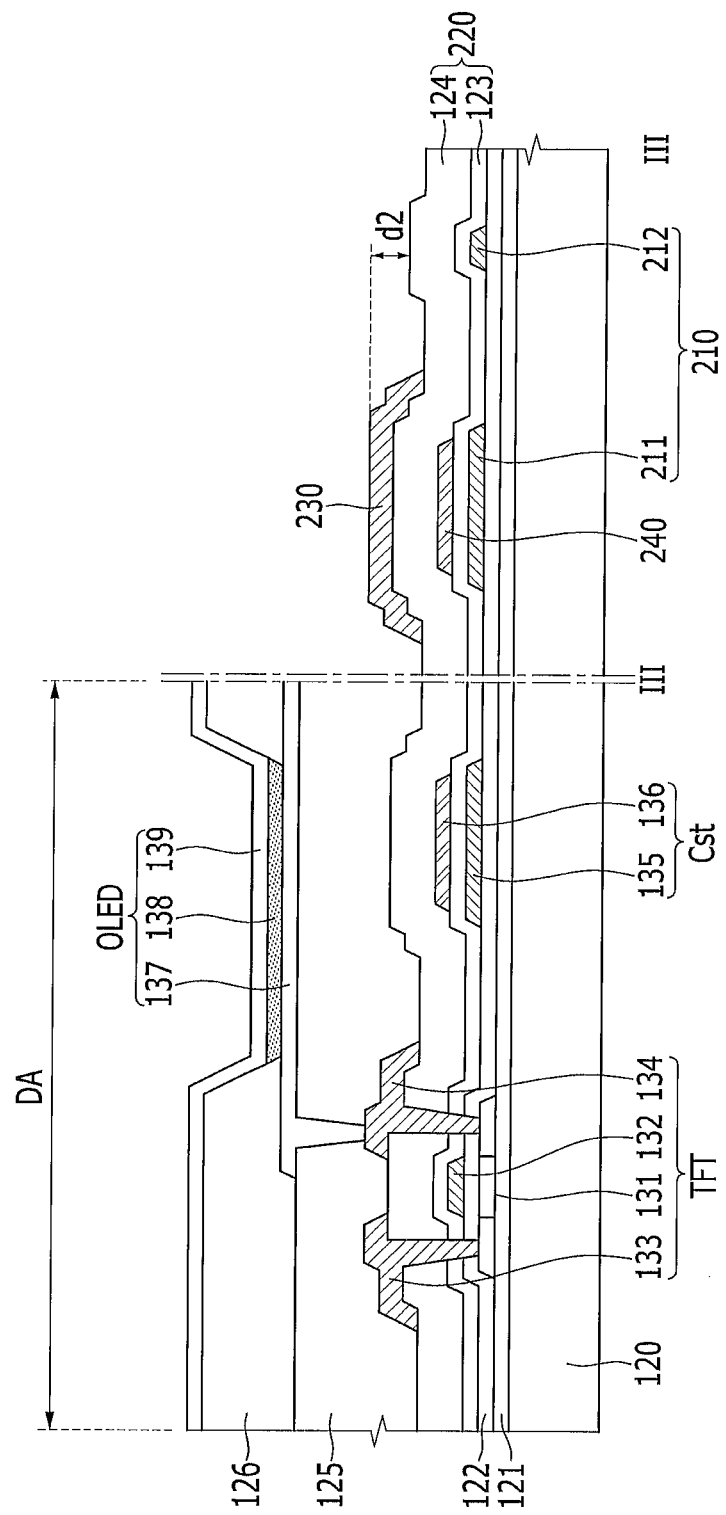
FIG. 3 is a cross-sectional view of FIG. 2 taken along line III-III.
Figure 4:
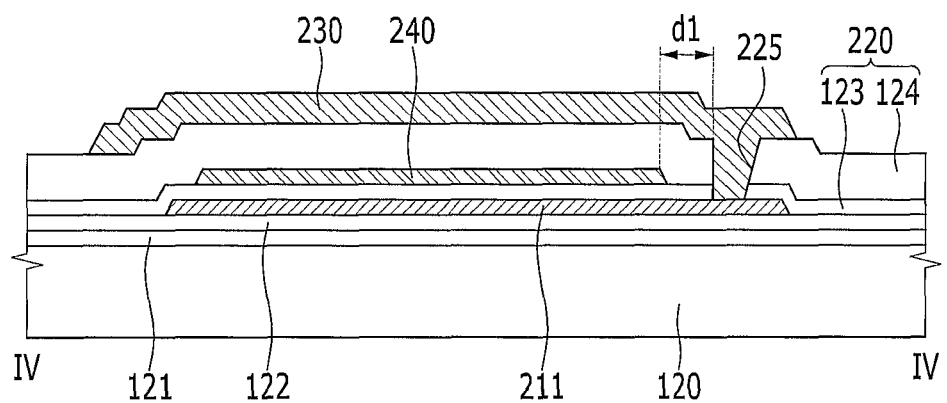
FIG. 4 is a cross-sectional view of FIG. 2 taken along line IV-IV.

FIG. 2 is a plan view illustrating a pad electrode unit 200 of a second wiring unit in the display panel illustrated in FIG. 1, and FIGS. 3 and 4 are cross-sectional views of FIG. 2 taken along lines and IV-IV, respectively. FIG. 3 illustrates the display area and the pad electrode unit.

Referring to FIGS. 2 to 4, the pad electrode unit 200 includes a first metal layer 210, an insulating layer 220, a second metal layer 230, and a dummy metal layer 240. The first metal layer 210 includes a terminal 211 having a substantially rectangular shape, and a wiring 212 connecting the terminal 211 and the signal line of the display area DA. The wirings 212 configure the aforementioned second wiring unit 180 and can be formed in substantially parallel to and at a distance from each other.

In order to arrange a greater number of terminals 211 in a limited area, the terminals 211 may be arranged with zigzag patterns in two columns. That is, the terminals 211 in two columns are positioned below the terminals 211 in one column, and the wirings 212 connected to the terminals 211 in two columns pass through the terminals 211 in one column.

An insulating layer 220 covers and protects the first metal layer 210 and has via holes 225 exposing the terminals 211, respectively. The via hole 225 formed in the insulating layer 220 may be formed with a minimum size providing a communication function. For example, two via holes 225 may be biased at one side of the terminals 211, and a region exposed by the via holes 225 of the terminals 211 may be about ⅕ or less of the entire area of the terminals 211.

A second metal layer 230 corresponding to each terminal 211 is formed on the insulating layer 220. The second metal layer 230 contacts the terminals 211 through the via holes 225 and may be larger than the terminals 211. The second metal layer 230 as a portion that actually functions as a pad is connected to a bump of the driving chip 150 through conductive balls included in an anisotropic conductive film.

The dummy metal layer 240 is formed between the terminals 211 and the second metal layer 230. The dummy metal layer 240 may be insulated from both the terminals 211 and the second metal layer 230. The insulating layer 220 may include a first insulating layer 123 covering the first metal layer 210 and a second insulating layer 124 covering the dummy metal layer 240. The via holes 225 are formed in the first and second insulating layers 123 and 124, and the second metal layer 230 is formed on the second insulating layer 124.

The dummy metal layer 240 may be positioned at a planar distance d1 from the via holes 225. In some embodiments, the dummy metal layer 240 does not overlap the via holes 225 and covers most of the terminals 211 which are not exposed by the via holes 225. The dummy metal layer 240 is positioned between the terminals 211 and the second metal layer 230, and as a result, the second metal layer 230 is formed to be higher than the substrate 120 by a thickness of the dummy metal layer 240.

In some embodiments, the surface of the second metal layer 230 has a height difference of d2 from the surface of the insulating layer 220 covering the wiring 212. The height difference d2 as a value obtained by adding the thickness of the second metal layer 230 to the thickness of the dummy metal layer 240 may be about 8,800 Å to about 9,000 Å. The height difference d2 is larger than the deformed degree of the conductive balls included in the anisotropic conductive film by pressure, and may be about 3,000 Å to about 10,000 Å. Depending on the embodiments, d2 can be less than about 3,000 Å or greater than about 10,000 Å.

Figure 5:
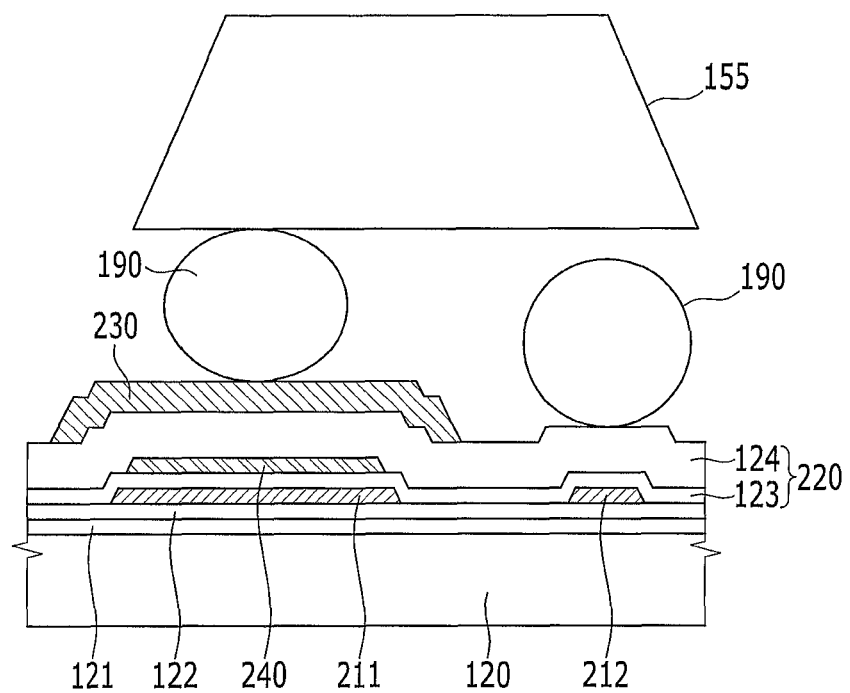
FIG. 5 is a cross-sectional view illustrating the pad electrode unit and a bump of the driving chip illustrated in FIG. 3.

FIG. 5 is a cross-sectional view illustrating the pad electrode unit and a bump of a driving chip illustrated in FIG. 3.

Referring to FIG. 5, the second metal layer 230 is connected to the bump 155 of the driving chip by the anisotropic conductive film. When the anisotropic conductive film as an adhesive film including a plurality of conductive balls 190 presses the driving chip, the second metal layer 230 and the bump 155 communicate with each other while the conductive balls 190 are pressed between the second metal layer 230 and the bump 155.

In the process of pressing the driving chip, misalignment in which the bump 155 is not arranged directly on the second metal layer 230 but biased toward the wiring 212 may occur. In the exemplary embodiment, the surface of the insulating layer 220 covering the wiring 212 is positioned to be lower than the surface of the second metal layer 230 with the height difference (about 3,000 Å to about 10,000 Å) of d2, and as a result, the conductive balls 190 on the insulating layer 220 do not press the insulating layer 220.

The diameter of the conductive ball 190 is about 2 μm (20,000 Å), and the degree pressed by pressure is about 3,000 Å to about 4,000 Å. Since the surface of the insulating layer 220 covering the wiring 212 is positioned to be lower than the surface of the second metal layer 230 with the height difference of d2, when the pressure of the driving chip is transferred to the bump 155 to press the conductive balls 190 on the second metal layer 230, the conductive balls 190 on the second metal layer 230 do not contact the bump 155 and are not pressed even while contacting the bump 155.

Accordingly, the display device 100 of the exemplary embodiment may prevent a crack from being generated on the insulating layer 220 covering the wirings 212 and efficiently prevent corrosion and disconnection of wirings 212 due to the crack.

The pad electrode unit 200 having the aforementioned configuration may be formed with the same material on the same layer as elements configuring the thin film transistor and the storage capacitor of the display unit 130.

Referring to FIG. 3, a buffer layer 121 is formed on the substrate 120. The buffer layer 121 serves to prevent an impurity element from permeating through the substrate 120 and provide a flat surface to the top of the substrate 120. The buffer layer 121 may include an inorganic material such as SiO2 and SiNx or an organic material such as polyimide, polyester, and acryl.

The thin film transistor TFT is formed on the buffer layer 121. The thin film transistor TFT includes an active layer 131, a gate electrode 132, a source electrode 133, and a drain electrode 134. The active layer 131 may be formed of polysilicon or an oxide semiconductor, and in the case of the oxide semiconductor, a separate passivation layer may be added onto the active layer 131. The active layer 131 includes a channel region, and a source region and a drain region which are positioned at both sides of the channel region and doped with impurities.

A first gate insulating layer 122 is formed on the active layer 131, and a gate electrode 132, a first storage capacitor plate 135, and a first metal layer 210 are formed on the first gate insulating layer 122. The gate electrode 132 overlaps with the channel region of the active layer 131. The first metal layer 210 is formed in the non-display area and includes a terminal 211 and a wiring 212. The gate electrode 132, the first storage capacitor plate 135, and the first metal layer 210 may include Ag, Au, Cu, Ni, Pt, Pd, Al, Mo, and the like.

On the gate electrode 132, the first storage capacitor plate 135, and the first metal layer 210, a second gate insulating layer 123 is formed. The first gate insulating layer 122 and the second gate insulating layer 123 may include an inorganic material such as SiO2 and SiNx or an organic material. On the second gate insulating layer 123, a second storage capacitor plate 136 and a dummy metal layer 240 are formed.

The second storage capacitor plate 136 overlaps the first storage capacitor plate 135, and the first and second storage capacitor plates 135 and 136 configure a storage capacitor Cst using the second gate insulating layer 123 as a dielectric material. The dummy metal layer 240 overlaps the terminal 211 and is formed to be smaller than the terminal 211. The second storage capacitor plate 136 and the dummy metal layer 240 may include the same material as the gate electrode 132.

On the second storage capacitor plate 136 and the dummy metal layer 240, an interlayer insulating layer 124 is formed. The interlayer insulating layer 124 includes an inorganic material such as SiO2 and SiNx and may have a double-layer structure of a SiO2 layer and a SiNx layer. A source electrode 133, a drain electrode 134, and a second metal layer 230 are formed on the interlayer insulating layer 124.

In this case, the source electrode 133 and the drain electrode 134 contact the source region and the drain region of the active layer 131 through via holes formed in the interlayer insulating layer 124 and the first and second gate insulating layers 122 and 123, respectively. In addition, the second metal layer 230 contacts the terminal 211 of the first metal layer 210 through the via holes 225 formed in the interlayer insulating layer 124 and the second gate insulating layer 123. The source electrode 133 and the drain electrode 134 may be formed by a multi-layered metal layer such as Mo/Al/Mo or Ti/Al/Ti.

The thin film transistor TFT is covered and protected by the passivation layer 125 and electrically connected to the organic light emitting diode (OLED) to drive the organic light emitting diode (OLED). The passivation layer 125 is formed of an inorganic insulating layer or an organic insulating layer, or may be formed by a laminated structure of the inorganic insulating layer and the organic insulating layer. The inorganic insulating layer may include SiO2, SiNx, Al2O3, TiO2, Ta2O5, HfO2, ZrO2, or the like, and the organic insulating layer may include polymethylmethacrylate (PMMA), polystyrene (PS), an acryl-based polymer, an imide-based polymer, an arylether-based polymer, or the like.

The organic light emitting diode (OLED) is formed on the passivation layer 125, and includes a pixel electrode 137, an organic emission layer 138, and a common electrode 139. One pixel electrode 137 is provided for each subpixel and contacts the drain electrode 124 through the via hole formed in the passivation layer 125. The common electrode 139 is formed on the entire display area DA. The organic emission layer 138 includes a light emission layer, and may include at least one of a hole injection layer, a hole transport layer, an electron transport layer, and an electron injection layer. Reference numeral 126 represents a pixel defining layer.

Any one of the pixel electrode 137 and the common electrode 139 serves as an anode that injects a hole to the organic emission layer 138, and the other electrode serves as a cathode that injects an electron. In the case where the display device 100 is a front emission type, the pixel electrode 137 is formed by a metal reflective film, and the common electrode 139 is formed by a transparent conductive film or a translucent conductive film. The light emitted from the organic emission layer 138 is reflected from the pixel electrode 137 and passes through the common electrode 139 to be emitted to the outside.

The metal reflective film may include Au, Ag, Mg, Al, Pt, Pd, Ni, Nd, Ir, Cr, or the like. The transparent conductive film may include indium tin oxide (ITO), indium zinc oxide (IZO), ZnO, In2O3, or the like. The translucent conductive film may be formed as a metal thin film including Li, Ca, LiF/Ca, LiF/Al, Al, Ag, Mg, or the like, and a transparent film such as ITO, IZO, ZnO, or In2O3 may be laminated on the translucent conductive film.

A capping layer (not illustrated) may be formed on the common electrode 139. The capping layer serves to protect the organic light emitting diode (OLED) and optimize light efficiency through refractive index matching in the case of the front emission type. The capping layer may include an organic material such as α-NPD, NPB, TPD, m-MTDATA, Alq3, or CuPc.

A blocking layer (not illustrated) may be formed on the capping layer. The blocking layer may include an inorganic material such as LiF, MgF2, CaF2, or the like, and prevent the organic light emitting diode (OLED) from being damaged by plasma used in a process of forming an inorganic film of thin film encapsulation. The capping layer may have a function of optimizing light efficiency by matching a refractive index in the case of the front emission type, like the blocking layer.

Figure 6:
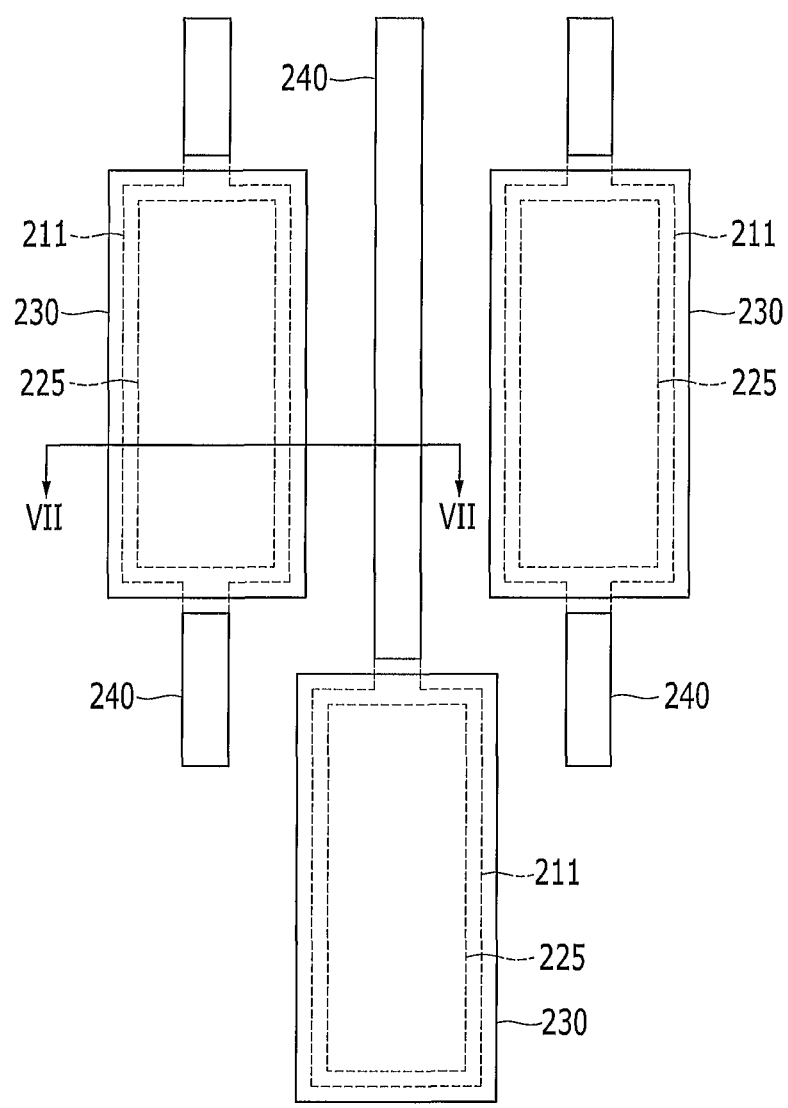
FIG. 6 is a plan view illustrating a pad electrode unit in a display device according to a second exemplary embodiment.
Figure 7:
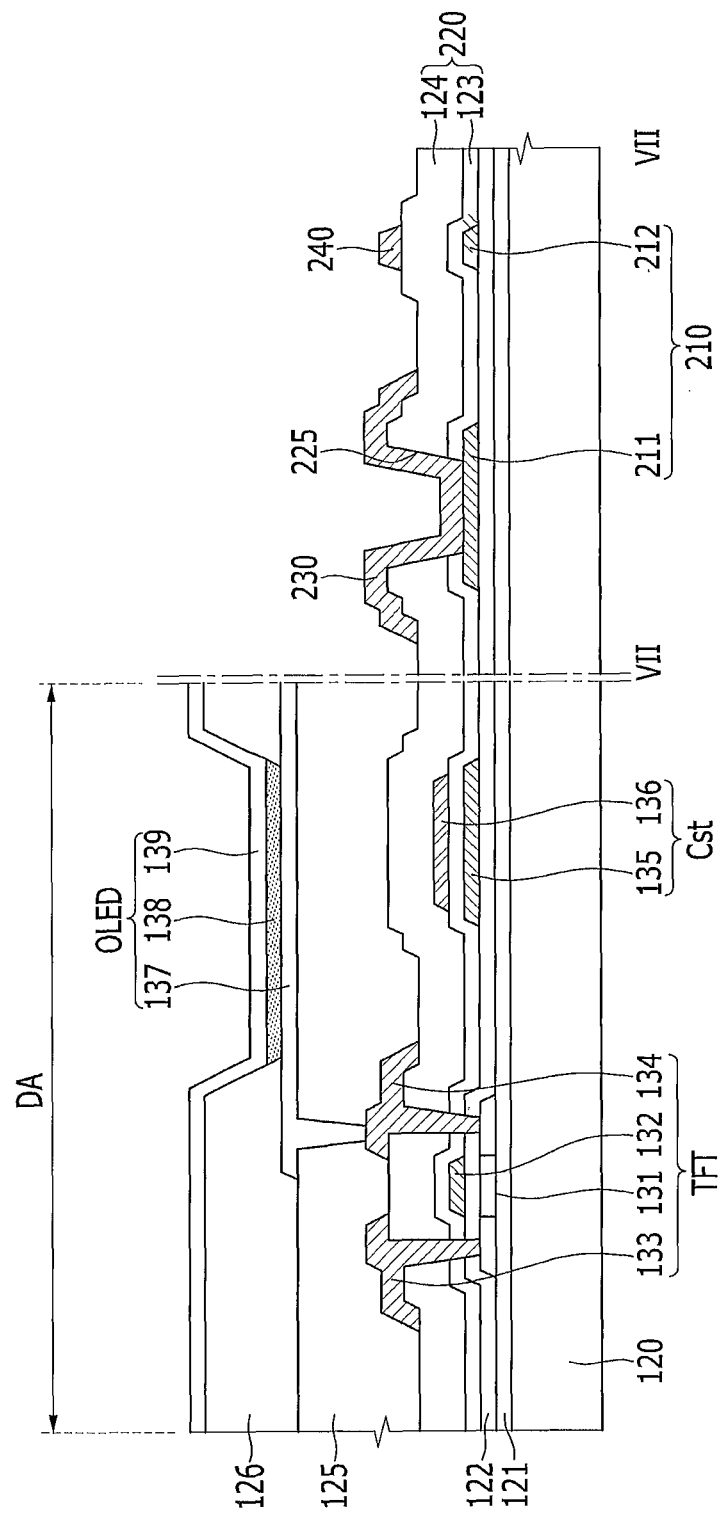
FIG. 7 is a cross-sectional view of FIG. 6 taken along line VII-VII.

FIG. 6 is a plan view illustrating a pad electrode unit 200A in a display device according to a second exemplary embodiment, and FIG. 7 is a cross-sectional view of FIG. 6 taken along line FIG. 7 illustrates the display area and the pad electrode unit.

Referring to FIGS. 6 and 7, a display device according to a second exemplary embodiment has a similar configuration to the aforementioned first exemplary embodiment except that the dummy metal layer 240 is formed on the insulating layer 220 covering the wiring 212. The same member as the first exemplary embodiment uses the same reference numeral, and hereinafter, the same configuration as the first exemplary embodiment will be mainly described.

The first metal layer 210 includes a terminal 211 having a substantially rectangular shape, and a wiring 212 connecting the terminal 211 and the signal line of the display area DA. The terminals 211 may be arranged with zigzag patterns in two columns, and the wirings 212 connected to the terminals 211 in two columns pass through the terminals 211 in one column.

An insulating layer 220 covers and protects the first metal layer 210 and has via holes 225 exposing the terminals 211, respectively. One via hole 225 is formed at the center of the terminal 211 and formed with a slightly smaller size than the terminal 211 so as to expose almost most of the terminals 211. A region exposed by the via holes 225 of the terminals 211 may be ⅔ or more of the entire area of the terminals 211.

A second metal layer 230 is formed on the insulating layer 220. The second metal layer 230 contacts the terminals 211 through the via holes 225 and may be larger than the via holes 225 and the terminals 211. The center contacting the terminal 211 of the second metal layer 230, as a portion that actually functions as a pad, is connected to a bump of the driving chip through conductive balls included in an anisotropic conductive film.

The dummy metal layer 240 is formed on the insulating layer 220 covering the wiring 212 and overlaps the wiring 212. The dummy metal layer 240 may be formed of the same material as the second metal layer 230 and formed with the same width as the wiring 212. The dummy metal layer 240 overlapping the wiring 212 is formed on the insulating layer 220, and as a result, the top surface of the portion where the wiring 212 is formed becomes the surface of the dummy metal layer 240.

Figure 8:
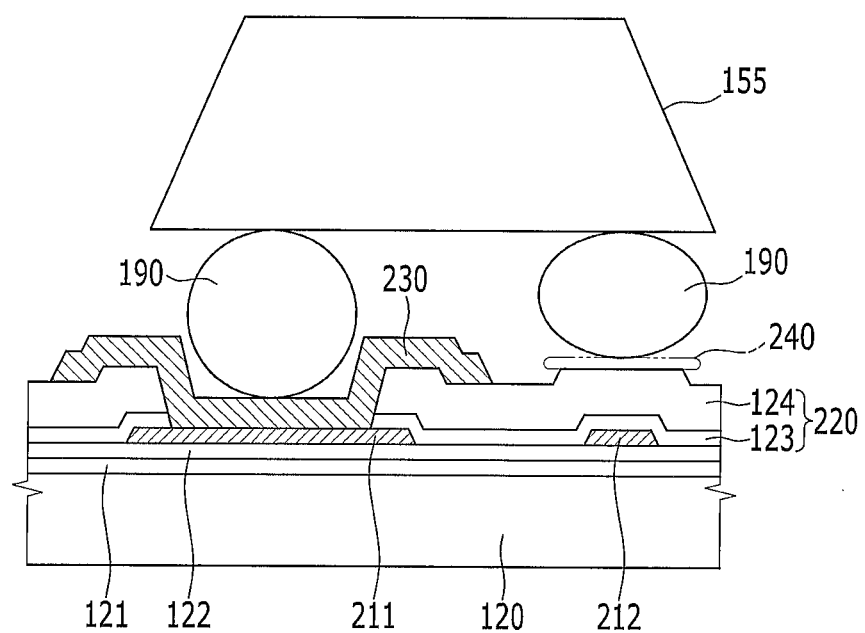
FIG. 8 is a cross-sectional view illustrating the pad electrode unit and a bump of the driving chip illustrated in FIG. 7.

FIG. 8 is a cross-sectional view illustrating the pad electrode unit 200A and a bump of a driving chip illustrated in FIG. 7.

Referring to FIG. 8, the center of the second metal layer 230 is connected to the bump 155 of the driving chip by the anisotropic conductive film. In the process of pressing the driving chip, misalignment in which the bump 155 is not arranged directly on the second metal layer 230 but biased toward the wiring 212 may occur.

Since the dummy metal layer 240 is formed on the insulating layer 220 covering the wiring 212, the conductive balls 190 on the insulating layer 220 do not directly press the insulating layer 220 but contact the dummy metal layer 240 to press the dummy metal layer 240. The insulating layer 220 including the inorganic material has brittleness, and the dummy metal layer 240 including aluminum has flexibility. The dummy metal layer 240 is damaged by pressure of the conductive balls 190 to prevent the pressure from being transferred to the insulating layer 220 therebelow.

Accordingly, the display device of the exemplary embodiment may prevent a crack from being generated on the insulating layer 220 covering the wirings 212 and efficiently prevent corrosion and disconnection of wirings 212 due to the crack.

The pad electrode unit 200A having the aforementioned configuration may be formed with the same material on the same layer as elements configuring the thin film transistor and the storage capacitor of the display unit 130.

Referring to FIG. 7, the first metal layer 210 may be formed on the first gate insulating layer 122 with the same material as the gate electrode 132 and the first storage capacitor plate 135. The second metal layer 230 and the dummy metal layer 240 may be formed on the interlayer insulating layer 124 with the same material as the source electrode 133 and the drain electrode 134. The insulating layer 220 of the pad electrode unit 200A includes a second gate insulating layer 123 and an interlayer insulating layer 124.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a substrate including a display area and a non-display area; and
   a pad electrode unit formed in the non-display area,
   wherein the pad electrode unit includes:
   a plurality of first metal layers respectively including a plurality of terminals arranged substantially parallel to each other and a plurality of wirings extending from the terminals and covered by an insulating layer;
   a plurality of second metal layers formed over the insulating layer and connected to the terminals; and
   a plurality of dummy metal layers formed between the terminals and the second metal layers or on a top surface of the insulating layer covering the wirings.

2. The display device of claim 1, wherein the terminals are arranged in a substantially zigzag pattern in two columns, and wherein the wirings connect the terminals and signal lines of the display area, respectively.

3. The display device of claim 1, wherein the insulating layer has a plurality of via holes partially exposing the terminals and positioned to be closer to one side of each of the terminals, and wherein the second metal layers contact the terminals through the via holes.

4. The display device of claim 3, wherein the dummy metal layers are formed between the terminals and the second metal layers and positioned at a planar distance from the via holes.

5. The display device of claim 4, wherein the dummy metal layers are insulated from the terminals and the second metal layers by the insulating layer.

6. The display device of claim 4, wherein a top surface of each of the second metal layers is positioned to be higher than the top surface of the insulating layer, covering the wirings from the substrate, by about 3,000 Å to about 10,000 Å.

7. The display device of claim 4, wherein the display area includes i) source and drain electrodes, ii) a gate electrode interposed between first and second gate insulating layers, the second gate insulating layer being interposed between first and second storage capacitor plates, and iii) an interlayer insulating layer formed over the second storage capacitor plate, wherein the first metal layers are formed over the first gate insulating layer with the same material as the gate electrode and the first storage capacitor plate, wherein the dummy metal layers are formed over the second gate insulating layer with the same material as the second storage capacitor plate, and wherein the second metal layers are formed over the interlayer insulating layer with the same material as the source and drain electrodes.

8. The display device of claim 3, wherein the dummy metal layers overlap none of the via holes.

9. The display device of claim 3, wherein the dummy metal layers cover the majority of the terminals that are not exposed by the via holes.

10. The display device of claim 1, wherein each of the dummy metal layers at least partially overlaps the wiring of the corresponding first metal layer and is formed of the same material as the second metal layers.

11. The display device of claim 10, wherein the display area includes i) source and drain electrodes, ii) a gate electrode interposed between first and second gate insulating layers, the second gate insulating layer being interposed between first and second storage capacitor plates, and iii) an interlayer insulating layer formed over the second storage capacitor plate, wherein the first metal layers are formed over the first gate insulating layer with the same material as the gate electrode and the first storage capacitor plate, and wherein the second metal layers and the dummy metal layers are formed over the interlayer insulating layer with the same material as the source and drain electrodes.

12. The display device of claim 1, further comprising a driving chip mounted on the pad electrode unit, wherein an output terminal of the driving chip is fixed to the pad electrode unit.

13. The display device of claim 1, wherein the first and second metal layers have substantially the same length and width.

14. The display device of claim 1, wherein each of the first metal layers has a substantially rectangular shape, and wherein the wiring of the corresponding first metal layer extends from at least one of the top and bottom sides thereof.

15. The display device of claim 1, wherein each of the second metal layers is greater in area than the terminal of the corresponding first metal layer and the corresponding dummy metal layer.

16. A display device, comprising:
   a substrate including a display area and a non-display area; and
   a pad electrode unit formed in the non-display area, wherein the pad electrode unit includes:
   a plurality of first metal layers each including a body portion and a wiring portion extending from the body portion;
   an insulating layer covering the first metal layers;
   a plurality of second metal layers formed over the insulating layer and connected to the body portions; and
   a plurality of dummy metal layers formed between the body portions of the first metal layers and the second metal layers.

17. The display device of claim 16, wherein the insulating layer has a plurality of via holes partially exposing the body portions of the first metal layers, and wherein the second metal layers contact the body portions of the first metal layers through the via holes.

18. The display device of claim 17, wherein the dummy metal layers overlap none of the via holes.

19. The display device of claim 17, wherein the dummy metal layers cover the majority of the body portions that are not exposed by the via holes.

20. The display device of claim 16, wherein each of the body portions of the first metal layers is substantially aligned with the corresponding second metal layer and dummy metal layer in the depth dimension of the display device.

* * * * *